United States Patent
Lin et al.

(10) Patent No.: US 9,583,424 B2
(45) Date of Patent: Feb. 28, 2017

(54) INTEGRATED CIRCUIT STRUCTURE AND METHOD FOR REDUCING POLYMER LAYER DELAMINATION

(71) Applicant: Taiwan Semiconductor Manufacturing Company, Ltd., Hsin-Chu (TW)

(72) Inventors: Jing-Cheng Lin, Hsin-Chu (TW); Jui-Pin Hung, Hsin-Chu (TW); Hsien-Wen Liu, Hsin-Chu (TW); Min-Chen Lin, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/901,311

(22) Filed: May 23, 2013

(65) Prior Publication Data

US 2014/0346665 A1 Nov. 27, 2014

(51) Int. Cl.
| | | |
|---|---|---|
| *H01L 21/768* | (2006.01) | |
| *H01L 23/498* | (2006.01) | |
| *H01L 23/522* | (2006.01) | |
| *H01L 23/31* | (2006.01) | |
| *H01L 23/525* | (2006.01) | |

(Continued)

(52) U.S. Cl.
CPC .... *H01L 23/49811* (2013.01); *H01L 23/3114* (2013.01); *H01L 23/3171* (2013.01); *H01L 23/3192* (2013.01); *H01L 23/525* (2013.01); *H01L 23/5329* (2013.01); *H01L 23/5389* (2013.01); *H01L 24/19* (2013.01); *H01L 21/568* (2013.01); *H01L 2224/0401* (2013.01); *H01L 2224/04105* (2013.01); *H01L 2224/05027* (2013.01); *H01L 2224/05166* (2013.01); *H01L 2224/05582* (2013.01); *H01L 2224/05647* (2013.01); *H01L 2224/1134* (2013.01); *H01L 2224/12105* (2013.01); *H01L 2224/131* (2013.01); *H01L 2224/13147* (2013.01); *H01L 2224/96* (2013.01); *H01L 2924/181* (2013.01); *H01L 2924/18162* (2013.01)

(58) Field of Classification Search
USPC ................. 257/737, 738, E21.506, E23.068; 438/106
See application file for complete search history.

(56) References Cited

U.S. PATENT DOCUMENTS

2004/0209126 A1* 10/2004 Ziegler et al. ................ 428/702
2006/0291029 A1* 12/2006 Lin et al. ...................... 359/224
(Continued)

OTHER PUBLICATIONS

Topper, M., et al., "A Comparison of Thin Film Polymers for Wafer Level Packaging," Electronic Components and Technology Conference, Jun. 1-4, 2010, pp. 769-776.

*Primary Examiner* — Ori Nadav
*Assistant Examiner* — Vernon P Webb
(74) *Attorney, Agent, or Firm* — Slater Matsil, LLP

(57) ABSTRACT

An embodiment integrated circuit structure includes a substrate, a metal pad over the substrate, a post-passivation interconnect (PPI) structure over the substrate and electronically connected to the metal pad, a first polymer layer over the PPI structure, an under bump metallurgy (UBM) extending into an opening in the first polymer layer and electronically connected to the PPI structure, and a barrier layer on a top surface of the first polymer layer adjacent to the UBM.

20 Claims, 9 Drawing Sheets

(51) Int. Cl.
*H01L 23/532* (2006.01)
*H01L 23/538* (2006.01)
*H01L 23/00* (2006.01)
*H01L 21/56* (2006.01)

(56) References Cited

U.S. PATENT DOCUMENTS

2011/0012239 A1* 1/2011 Gu .................. H01L 21/6836
                                                          257/637
2012/0056167 A1* 3/2012 Lau .................. B29C 67/0062
                                                          257/40
2013/0001776 A1* 1/2013 Yu et al. ................. 257/738

* cited by examiner

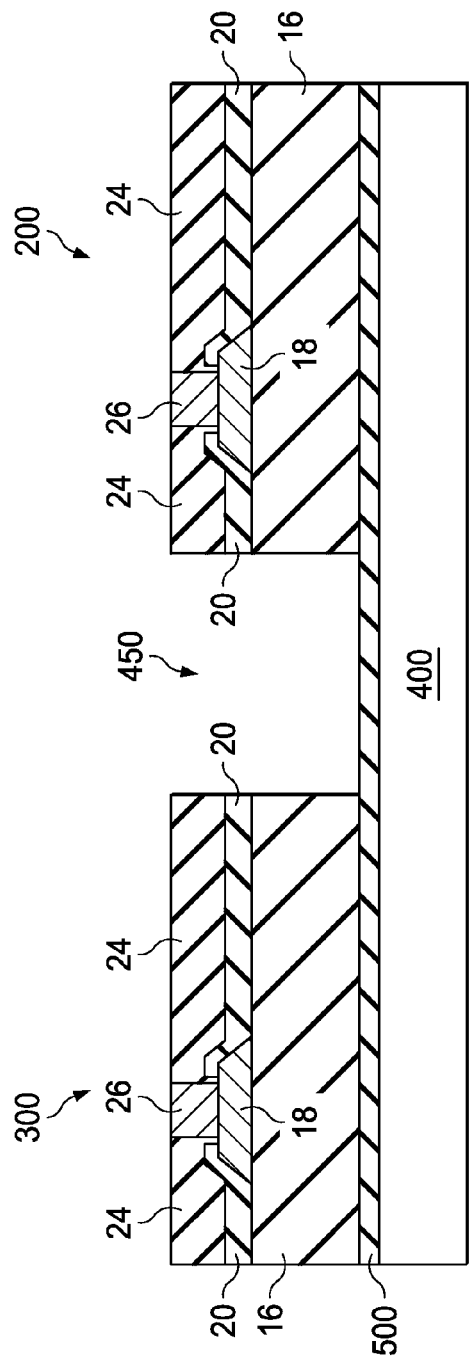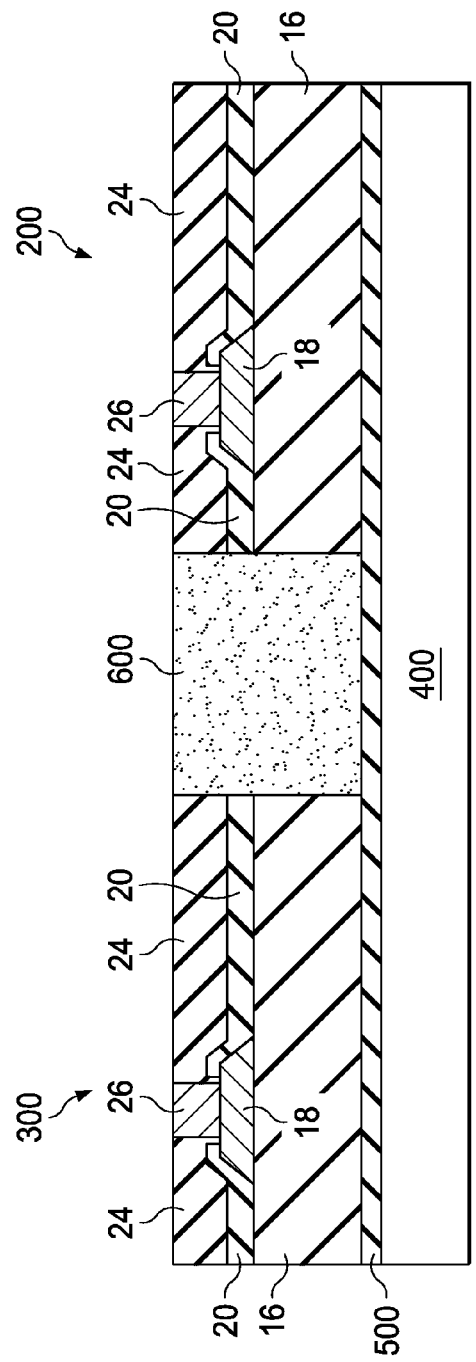

INTEGRATED CIRCUIT STRUCTURE AND METHOD FOR REDUCING POLYMER LAYER DELAMINATION

This application relates to the following co-pending and commonly assigned patent application Ser. No. 13/800,653, filed Mar. 13, 2013, entitled "Improved Adhesion between Post-Passivation Interconnect Structure and Polymer," which application is hereby incorporated herein by reference.

BACKGROUND

A typical integrated circuit structure is made up of dies that include active devices such as transistors and capacitors. These devices are initially isolated from each other, and interconnect structures are later formed over the active devices to create functional circuits. On top of the interconnect structures, bond pads are formed and exposed on the surface of the respective die. Electrical connections are made through the bond pads to connect the die to a package substrate or another die. In certain categories of conventional packaging technologies, such as fan-out wafer level packaging (FO-WLP), a post-passivation interconnect (PPI) structure (also known as redistribution layers (RDLs)) may be formed over the passivation layers of a die and electrically connected to the bond pads. This is followed by the formation of a polymer layer and under bump metallurgies (UBMs). The UBMs are formed in openings penetrating through the second polymer and electrically connected to the PPI structure. I/O pads such as solder balls may then be placed on the UBMs. An advantageous feature of this packaging technology is the possibility of forming fan-out packages, which means the I/O pads on a die can be redistributed to a greater area than the die, and hence the number of I/O pads packed on the surfaces of the dies can be increased. However, an issue with this packaging technology is reliability concerns regarding delamination of the polymer layer. Delamination issues have been observed in typical FO-WLP wafers subject to various durability tests, such as a PCT-168 hrs test, wherein the wafer is stressed under a high heat, pressure, and humidity condition for 168 hours. These delamination issues may further cause I/O pad breakages in the integrated circuit.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 9-11 are cross-sectional views of various stages of manufacture of an integrated circuit structure in accordance with alternate embodiments.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Various embodiments will be described with respect to a specific context, namely a fan-out wafer level packaging (FO-WLP) technology. Other embodiments may also be applied, however, to other packaging technologies such as wafer level chip scale packaging (WLCSP) or interposers having redistribution layers (RDLs).

FIGS. 1-6 illustrate cross-sectional views of various stages of manufacturing an integrated circuit structure according to various embodiments. A post-passivation interconnect (PPI) structure is formed over a die or a wafer to redistribute or redirect I/O pads in the wafer to a larger or different area. A polymer layer is formed over the PPI structure, followed by the formation of under bump metallurgies (UBMs) electrically connected to the PPI structure. A barrier layer is then formed on the exposed polymer layer for blocking moisture and reducing delamination.

Figure 1:
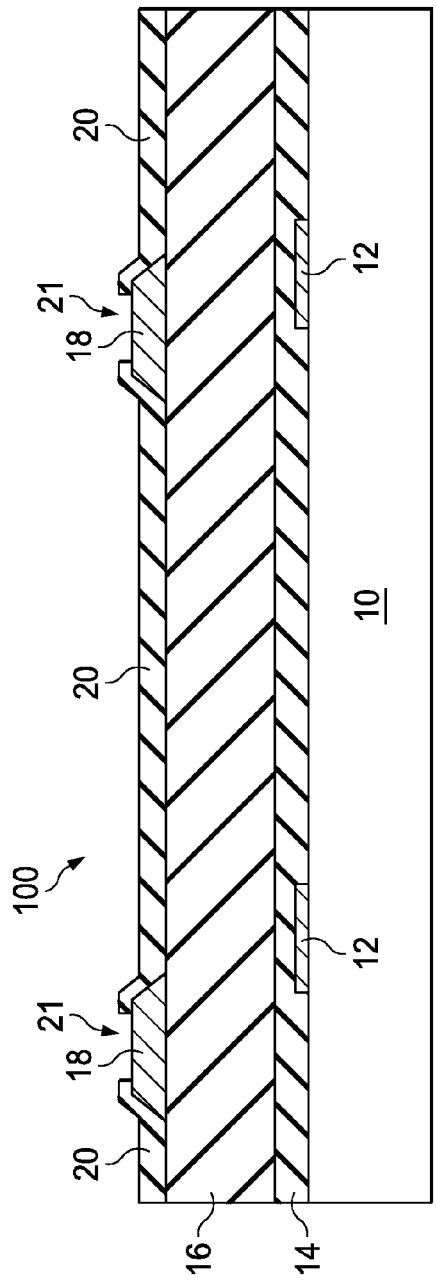
FIGS. 1-8 are cross-sectional views of intermediate stages of manufacture of an integrated circuit structure in accordance with various embodiments.

FIG. 1 illustrates a side view of a die 100, which includes a substrate 10. The substrate 10 may be a bulk silicon substrate although other semiconductor materials including group III, group IV, and group V elements may also be used. Active devices 12 such as transistors may be formed in and/or on the substrate 10. An inter-layer dielectric (ILD) 14 is formed over substrate 10, and various inter-metal dielectric layers (IMDs) 16 are formed over ILD 14. In some embodiments, the ILD 14 and/or IMDs 16 include at least one dielectric layer formed of low-k dielectric materials having k values, for example, lower than about 4.0. In some embodiments, the ILD 14 and/or the IMDs 16 may be made of, for example, silicon oxide, SiCOH, and the like.

Metal pads 18 are formed over the IMDs 16 and are electrically coupled to the active devices 12 through various metallic lines and vias (not shown) in the IMDs 16. The metal pads 18 may be made of aluminum, aluminum alloy, copper or copper alloy, although other metallic materials may be used. Passivation layer 20 is formed over the IMDs 16 and may be formed of non-organic materials such as silicon oxide, un-doped silicate glass, silicon oxynitride, and the like. Openings 21 are formed in portions of the passivation layer 20 to expose central portions of metal pads 18. Portions of passivation layer 20 may also cover edge portions of the metal pads 110. The formation details of the various features in FIG. 1 are well known in the art and not described herein.

Figure 2:
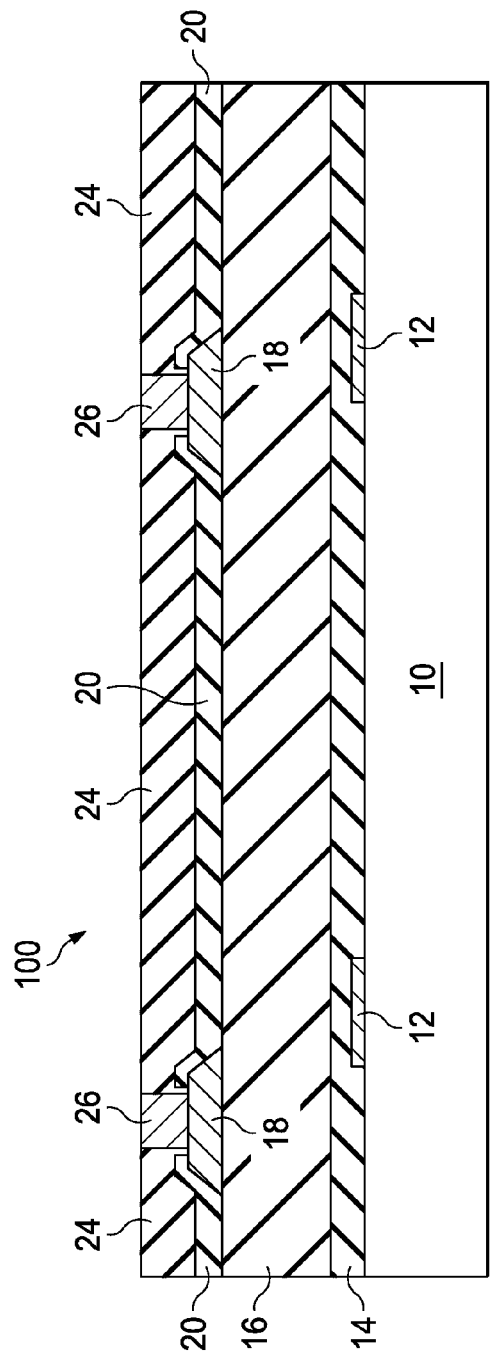

FIG. 2 illustrates the formation of a first polymer layer 24 over the passivation layer 20. The first polymer layer 24 may be formed of a material such as polyimide (PI), polybenzoxazole (PBO), benzocyclobuten (BCB), epoxy, silicone, acrylates, nano-filled pheno resin, siloxane, fluorinated polymer, polynorbornene, and the like. The first polymer layer 24 is patterned to expose portions of the metal pads 18 using, for example, a combination of photolithographic techniques and etching. Post-passivation interconnect (PPI, so named because they are formed after the formation of passivation layer 20) pads 26 may be formed on and electrically connect to the metal pads 18 through the openings in passivation layer 20 and the first polymer layer 24. The PPI pads 26 may alternatively be referred to as redistribution layer (RDL) pads 26. The first polymer layer 24 may be formed using, for example, spin on coating techniques. The PPI pads 26, may be formed of copper or a copper alloy although other metals such as aluminum or gold may be used. The formation methods of PPI pads 26 may include plating, electroless plating, sputtering, chemical vapor deposition (CVD), and the like. Usually an opening is filled with the metal and surface of the substrate covered by the process. Excess metal is then removed. The surface may be planarized in a chemical mechanical polishing (CMP) process.

Figure 3:
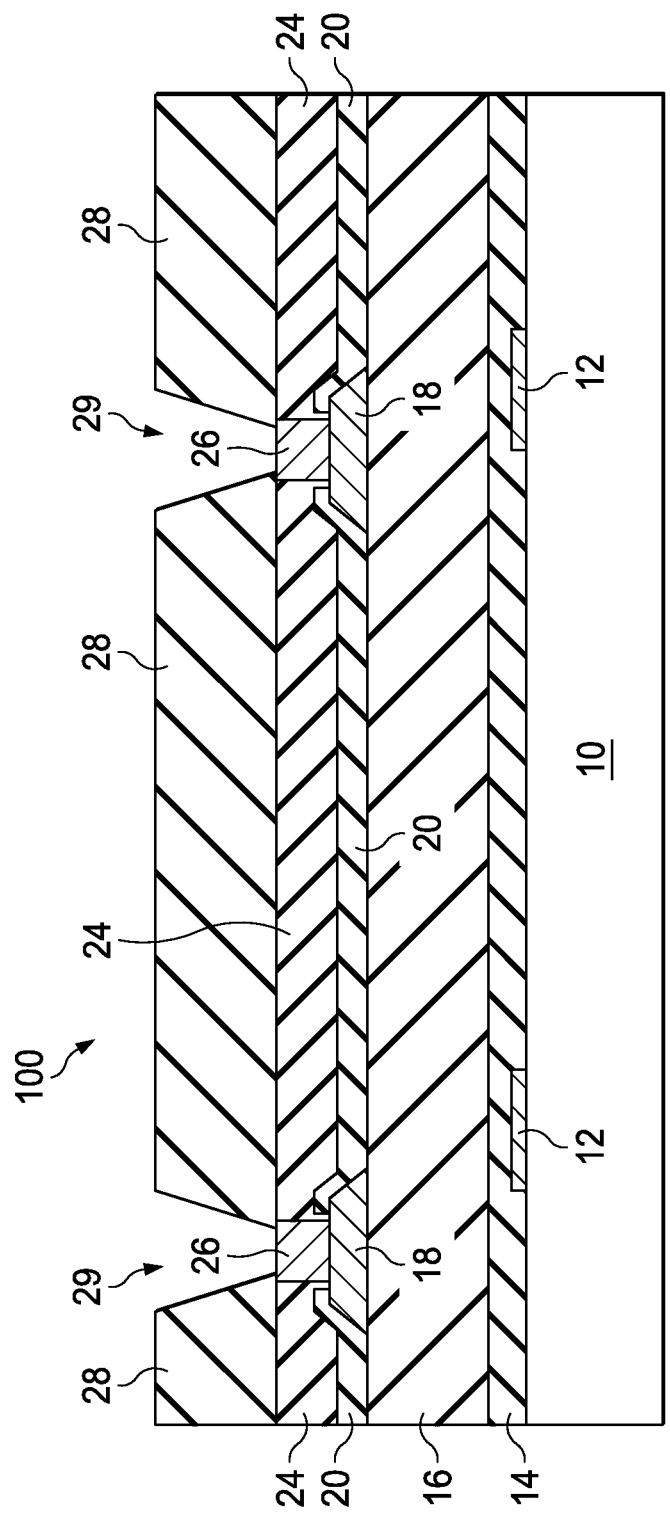

FIG. 3 shows the formation of a second polymer layer 28 over the first polymer layer 24. The second polymer layer 28 may be formed of the same material as the first polymer layer 24 using the same methods, or may be formed of a different material and/or using different methods. The second polymer layer 28 may be patterned to expose portions of the PPI pads 26 using the same methods as the methods used in patterning the first polymer layer 24.

Figure 4:
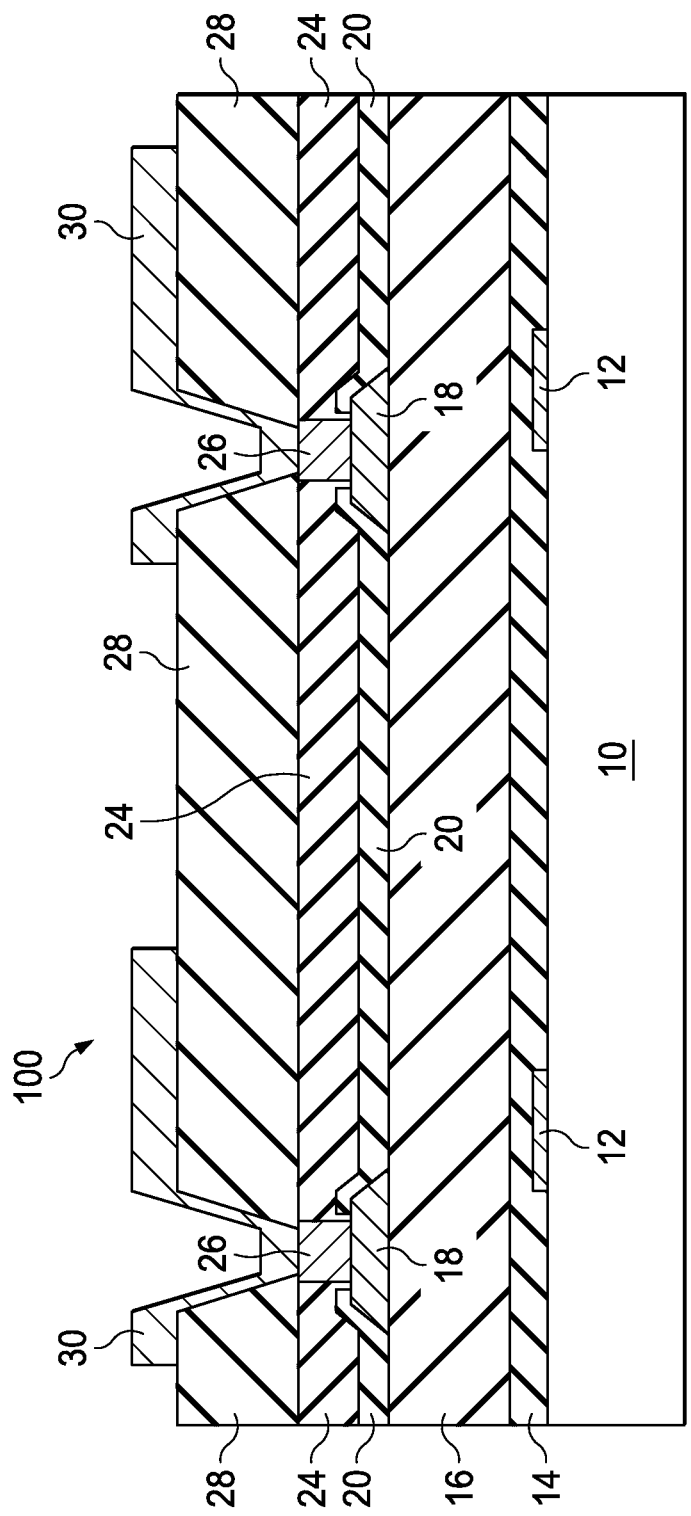

FIG. 4 shows the formation of a PPI structure 30 along sidewalls and bottom of the opening 29 in the second polymer layer 28, electrically connected to the PPI pad 26. The PPI structure 30 may extend to the surface of the second polymer layer 28 adjacent to the opening 29. The PPI structure 30 may also be referred to as an RDL structure because it allows I/O pads on the die 100 to be redistributed to a greater area than the die 100. The PPI structure 30 may alternatively be used to route electrical connections to a different region of die 100. The PPI structure 30 may be formed of copper or a copper alloy although other metals such as aluminum or gold may be used. The formation methods of PPI structure 30 may include plating, electroless plating, sputtering, chemical vapor deposition (CVD), and the like. Usually an opening is filled with the metal and surface of the substrate covered by the process. Excess metal is then removed. The surface may be planarized in a chemical mechanical polishing (CMP) process. In some embodiments, the PPI structure 30 and PPI pad 26 may be formed in the same process step. While FIG. 4 shows PPI structure 30 having only one PPI line; however in alternative embodiments, the PPI structure 30 may include multiple PPI lines formed in multiple polymer layers.

Figure 5:
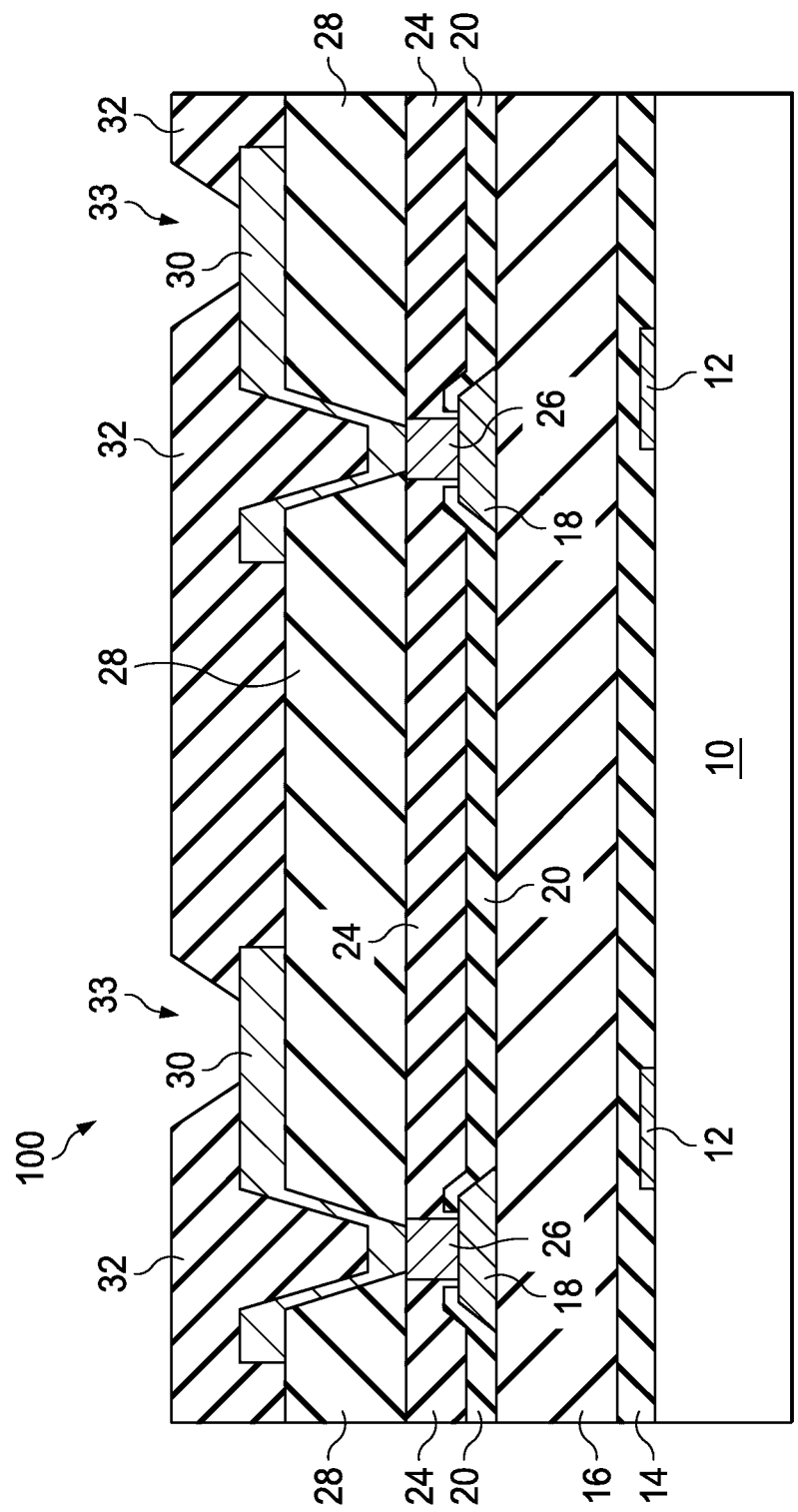

FIG. 5 shows the formation of a third polymer layer 32 over the PPI structure 30 and the second polymer layer 32. The third polymer layer 32 may be formed of the same materials and using the same techniques as the polymer layers 24 and 28 (e.g., a PBO layer using spin-on coating techniques), or may be formed of a different material and/or using different methods. The third polymer layer 32 is patterned to form openings 33 exposing the PPI structure 30, typically using the same methods as the methods used in patterning the first polymer layer 24 and/or the second polymer layer 28.

Figure 6:
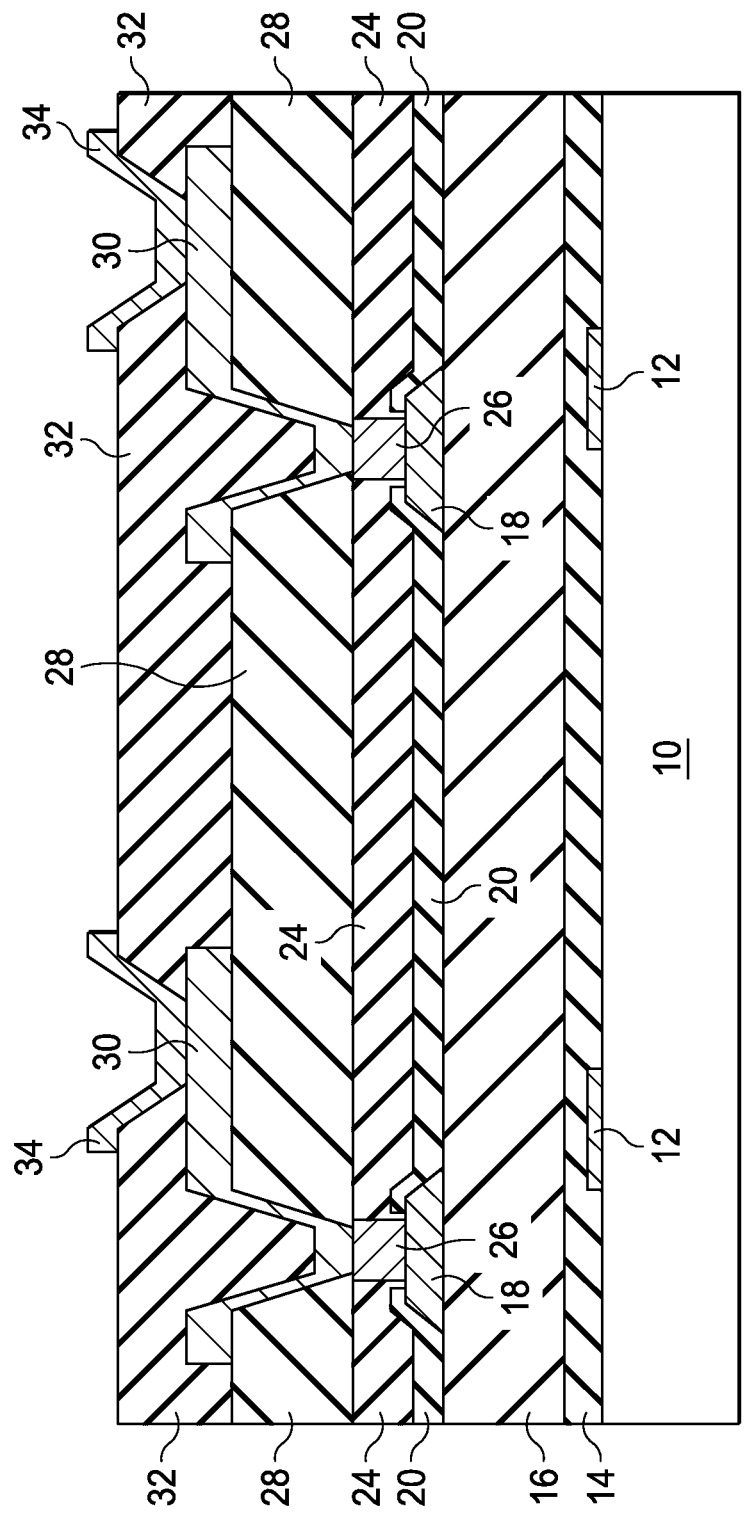

FIG. 6 illustrates the formation of under bump metallurgies (UBMs) 34 to extend into the openings 33 in the third polymer layer 32 and contact the PPI structure 30. The UBMs 34 may be formed of conductive materials such as copper, copper alloys, titanium, titanium alloys, or the like. In an embodiment, the UBM 126 include a titanium layer and a copper layer.

Figure 7:
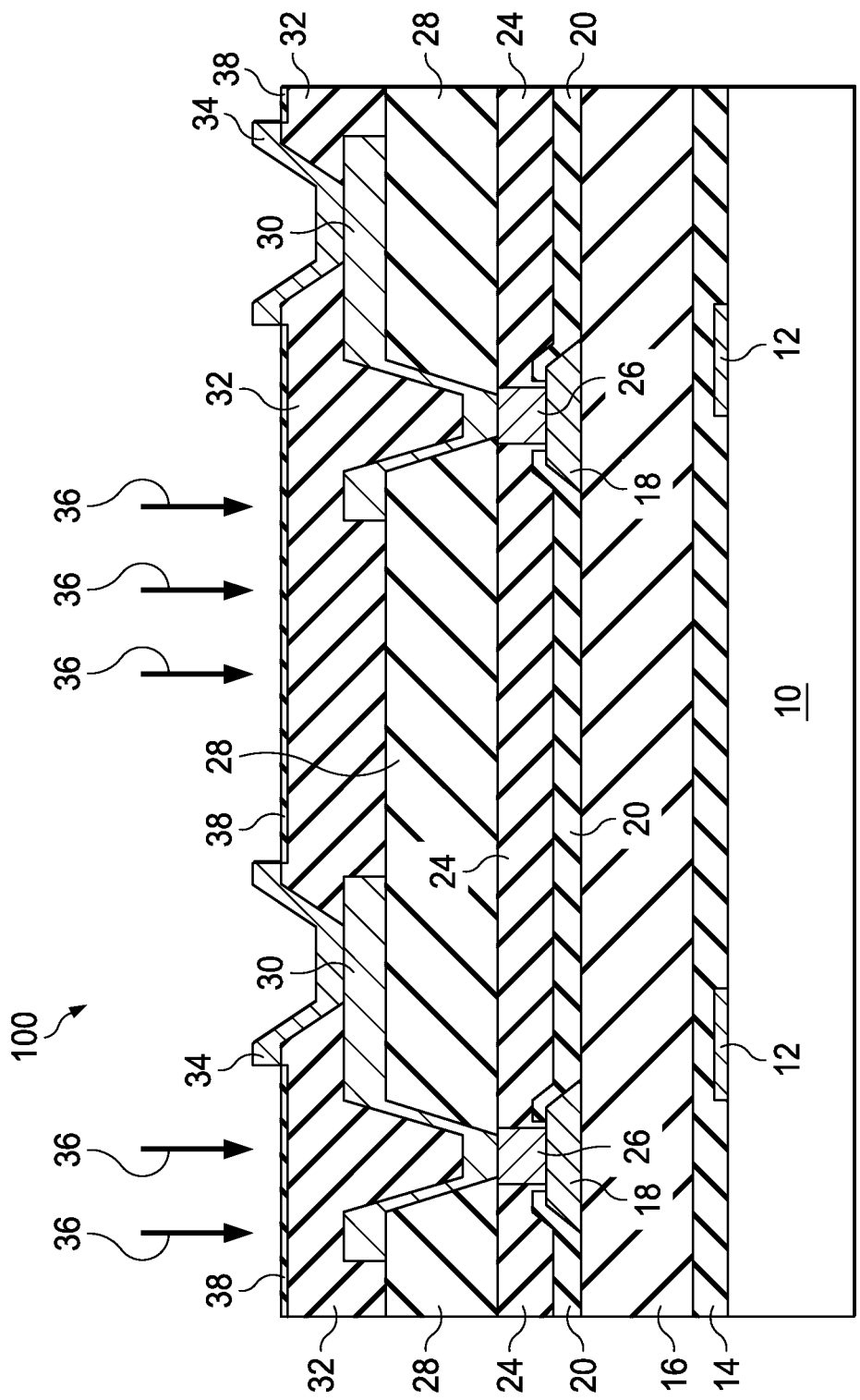

FIG. 7 illustrates a plasma treatment 36 performed on the resulted structure. The exposed surface of the third polymer layer 32 is condensed, and therefore the top surface of the third polymer layer 32 adjacent to the UBMs 34 forms a barrier layer 38 which can block moisture. In an embodiment, the plasma treatment 36 utilizes hydrogen containing plasma. The top surface of the third polymer layer 32 may be exposed to a hydrogen containing plasma. This may be done by exciting hydrogen gas using, for example, microwaves to ionize hydrogen gas and form hydrogen radicals. Therefore, the creation of hydrogen plasma introduces hydrogen ions on the top surface of the third polymer layer 32. A voltage may be applied under the substrate attracting the hydrogen ions and causing the hydrogen ions to react with the polymer material in the third polymer layer 32.

Thus, a condensation layer, referred to as a barrier layer herein, is formed. In an embodiment, the barrier layer 38 is a polymer layer including hydrogen. In some embodiments, the barrier layer 38 has a thickness in a range of about 1 nm to about 10 nm. For example, the barrier layer 38 is about 7 nm thick. By performing the plasma treatment 36 and forming the barrier layer 38 on the third polymer layer 32, moisture that would otherwise penetrate into the third polymer layer 32 is blocked by the barrier layer 38 and delamination of the third polymer layer 32 is reduced or eliminated. For example, after subjecting various integrated circuits to the same PCT-168 hour reliability test as previously described, substantially fewer delamination issues between third polymer layer 32 and the PPI structure 30 were observed in integrated circuits having a thin oxide film layer.

Figure 8:
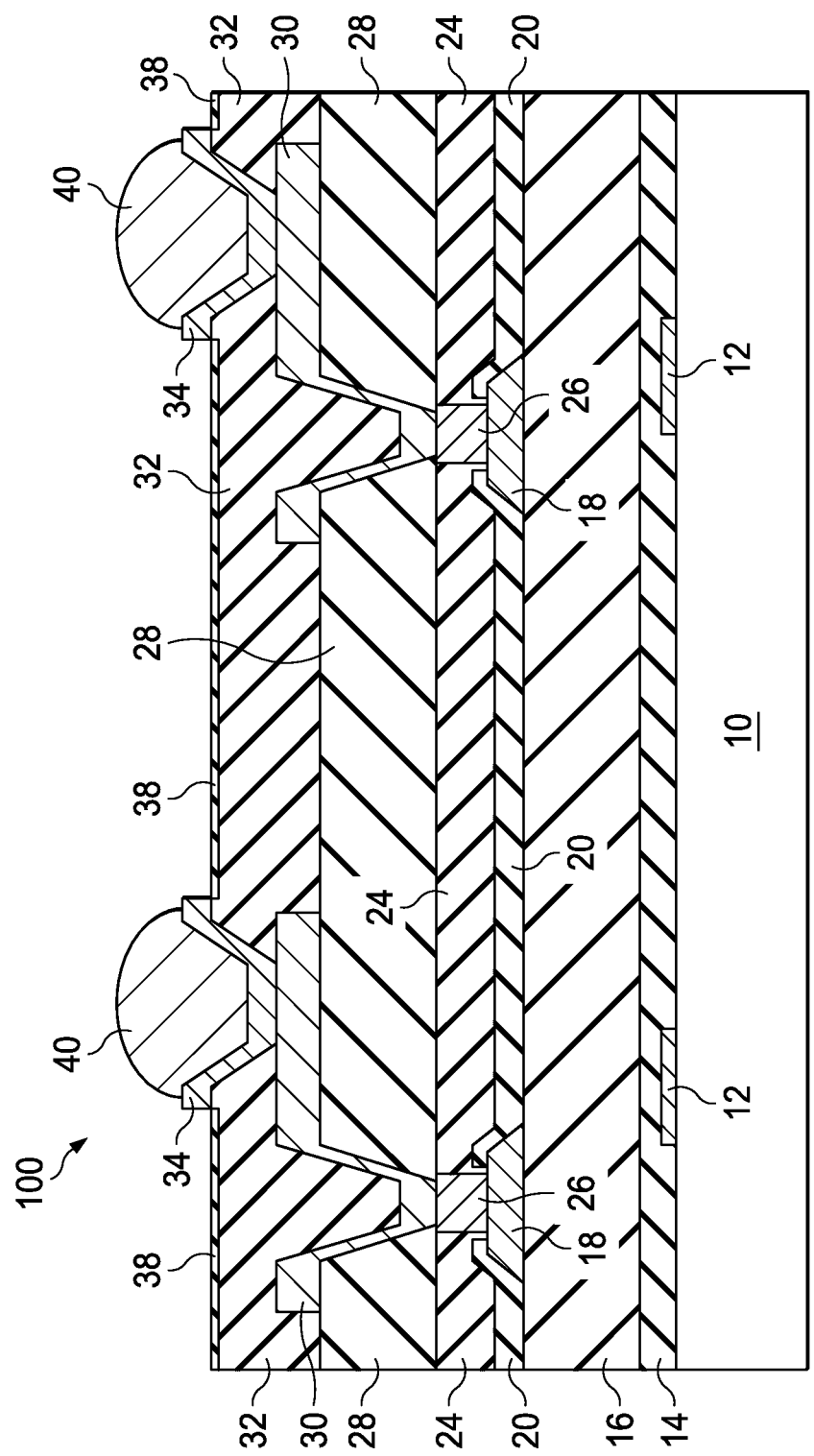

FIG. 8 illustrates the formation of bumps 40 formed on the UBMs 34. In some embodiments, the bumps 40 are solder balls, copper pillars, and the like. The bumps 40 are formed to electrically connect and bond to other package components such as a device die, an interposer, a printed circuit board (PCB), and the like.

Figure 11:
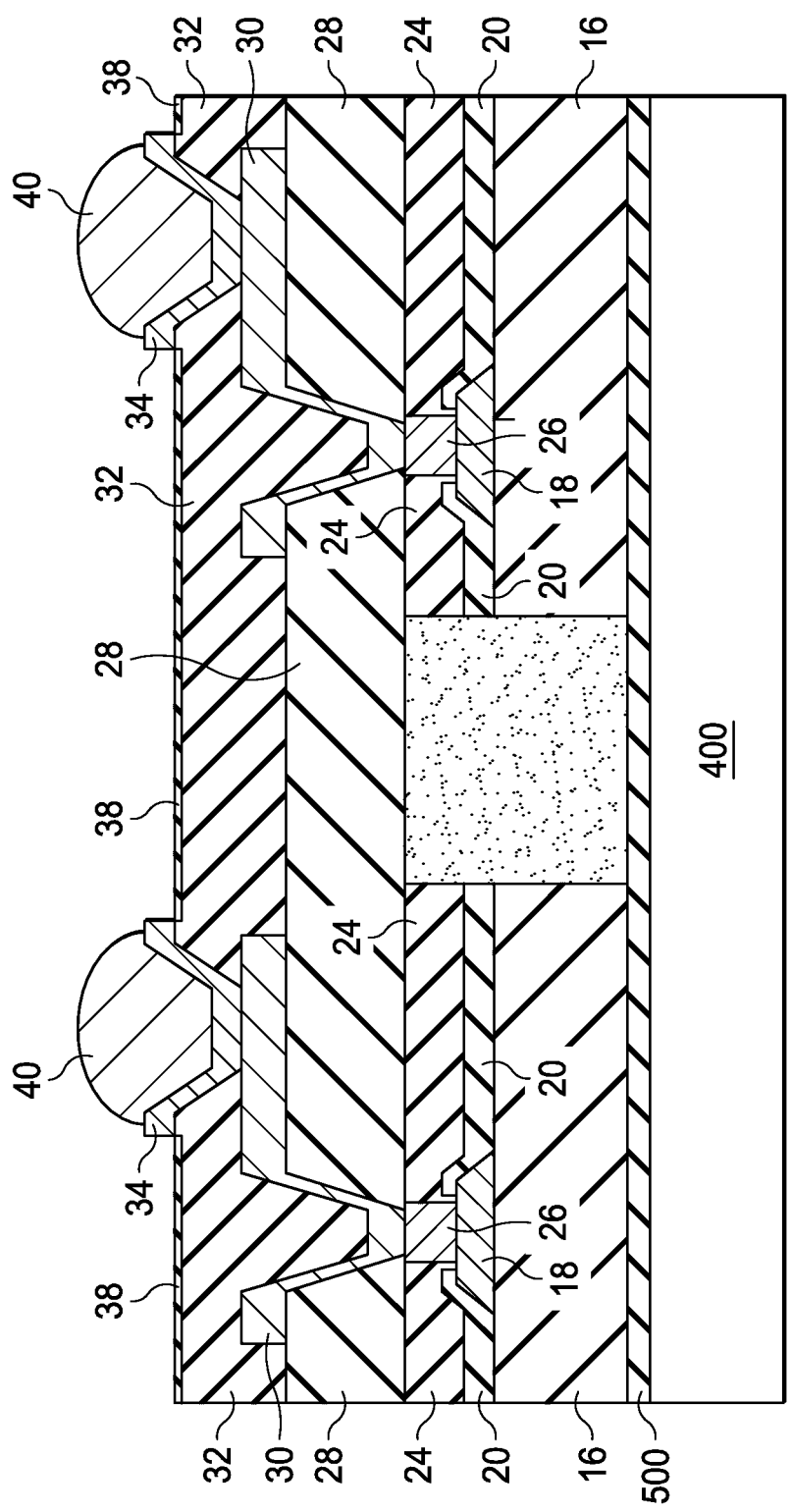

FIGS. 9-11 show various stages of manufacturing an integrated circuit structure according to alternative embodiments.

FIG. 9 illustrate multiple dies 200 and 300 disposed over a carrier 400 via an adhesive layer 500. Each of the multiple dies 200 and 300 includes the substrate 10, active devices 12, ILD 14, IMDs 16, metal pads 18, passivation layer 20, first polymer layer 24 and PPI pads 26, which are substantially similar to the features in FIG. 1-2. A pick and place machine may be used to place the dies 200 and 300 in predetermined locations on the carrier 400, for example. In some embodiments, the dies 200 and 300 are mounted face-up on the carrier wafer 200. The adhesive layer 500 may be formed of a glue, and carrier 400 may be made of silicon or glass in a wafer form.

FIG. 10 illustrates the filling of molding compound 600 filling spaces 450 between dies 200 and 300. The molding compound 600 may be an organic material such as an epoxy, which may be filled between dies 200 and 300 in liquid form. Subsequently, a curing process may be performed to solidify molding compound 600. A planarization, such as a grinding may be performed on molding compound 600 so that its top surface may be substantially level with the dies 200 and 300.

FIG. 11 illustrates the formation of subsequent polymer layers 28 and 32, PPI structure 30, UBMs 34, barrier layer 38, and bumps 40. These features are substantially similar to those previously discussed in FIGS. 3-8. Carrier 400 and adhesive layer 500 may be removed in a subsequent process step. In this manner, multiple dies may be packaged together to form FO-WLP including a thin oxide film layer that advantageously improves adhesion between the RDLs and an overlaying polymer layer.

In accordance with an embodiment, an method for forming an integrated circuit structure includes forming a post-passivation interconnect (PPI) structure over a substrate, wherein the substrate includes a metal pad and the PPI structure is electrically connected to the metal pad; forming a polymer layer over the PPI structure; forming an under bump metallurgy (UBM) extending into an opening in the polymer layer and electronically connected to the PPI structure; and performing a plasma treatment on the polymer layer.

In accordance with another embodiment, an integrated circuit structure includes a substrate, a metal pad over the substrate, a post-passivation interconnect (PPI) structure over the substrate and electronically connected to the metal pad, a first polymer layer over the PPI structure, an under bump metallurgy (UBM) extending into an opening in the first polymer layer and electronically connected to the PPI structure, and a barrier layer on a top surface of the first polymer layer adjacent to the UBM.

In accordance with yet another embodiment, an integrated circuit structure includes a first die, a second die and a molding compound filling a space between the first die and the second die, in which the first die includes a metal pad. The integrated circuit structure includes a post-passivation interconnect (PPI) structure overlying the first die and electrically connected to the metal pad, a first polymer layer over the PPI structure, a under bump metallurgy (UBM) formed in an opening in the first polymer layer and electrically connected the PPI structure, and a barrier layer on the top surface of the first polymer layer adjacent to the UBM.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An integrated circuit structure comprising:
   a substrate;
   a metal pad over the substrate;
   a post-passivation interconnect (PPI) structure over the substrate and electronically connected to the metal pad;
   a first polymer layer over the PPI structure, the first polymer layer including an untreated portion and a treated portion, the treated portion having a higher hydrogen concentration than the untreated portion;
   an under bump metallurgy (UBM) extending into an opening in the first polymer layer and electronically connected to the PPI structure, wherein a sidewall of the UBM is aligned with a sidewall of the treated portion of the first polymer layer and wherein the UBM extends over the untreated portion and does not extend over the treated portion layer; and
   the treated portion of the first polymer layer forming a barrier layer on a top surface of the untreated portion of the first polymer layer adjacent to the UBM, the barrier layer being nonconductive, wherein the barrier layer does not extend into the first portion of the top surface of the first polymer layer, a top surface of the treated portion of the first polymer layer being co-planar with a bottom surface of the UBM.

2. The integrated circuit structure of claim 1, wherein the barrier layer has a thickness of about 1 nm to about 10 nm.

3. The integrated circuit structure of claim 1, wherein the PPI structure comprises copper, and the UBM comprises copper.

4. The integrated circuit structure of claim 1, wherein the first polymer layer is selected from a group consisting of polyimide (PI), polybenzoxazole (PBO), benzocyclobuten (BCB), epoxy, silicone, acrylates, nano-filled pheno resin, siloxane, fluorinated polymer, polynorbornene, and combinations thereof.

5. The integrated circuit structure of claim 1, further comprising a bump on the UBM.

6. The integrated circuit structure of claim 1, further comprising a second polymer layer underlying the first polymer layer, and wherein the PPI structure is formed in an opening of the second polymer layer and electrically connected to the metal pad.

7. An integrated circuit structure comprising:
   a first die, a second die and a molding compound filling a space between the first die and the second die, wherein the first die comprises a metal pad;
   a copper pillar in physical contact with the metal pad, the copper pillar comprises a first surface facing away from the metal pad;
   a dielectric layer covering sidewalls of the copper pillar, the dielectric layer comprising a second surface facing away from the metal pad, the second surface extending from the copper pillar to a first edge of the first die, wherein the first surface, the second surface and a surface of the molding compound all lie in the same plane;
   a post-passivation interconnect (PPI) structure overlying the first die and electrically connected to the metal pad;
   a first polymer layer over the PPI structure, the first polymer layer including a surface region and a bulk region, the surface region having a higher hydrogen concentration relative to the bulk region;
   a under bump metallurgy (UBM) formed in an opening in the first polymer layer and electrically connected the PPI structure; and
   wherein the surface region of the first polymer layer forms a barrier layer on a top surface of the first polymer layer adjacent to the UBM, the barrier layer being nonconductive and extending in a direction towards the UBM no further than a sidewall of the UBM, the surface region of the first polymer layer being co-planar with a bottom surface of the UBM.

8. The integrated circuit structure of claim 7, further comprising a second polymer layer over the first die, the second die and the molding compound, wherein the PPI structure is formed in an opening in the second polymer layer and electrically connected to the metal pad.

9. The integrated circuit structure of claim 7, further comprising a bump on the UBM.

10. The integrated circuit structure of claim 7, wherein the barrier layer has a thickness of about 1 nm to about 10 nm.

11. An integrated circuit structure comprising:
    a substrate;
    a metal pad over the substrate;
    a post-passivation interconnect (PPI) structure over the substrate and electronically connected to the metal pad;
    a first polymer layer over the PPI structure, the first polymer layer having a top surface;
    an under bump metallurgy (UBM) extending into an opening in the first polymer layer and electronically connected to the PPI structure, wherein the UBM extends over a first portion of the top surface of the first polymer layer and does not extend over a second portion of the top surface of the first polymer layer; and
    wherein the top surface of the first polymer layer comprises a nonconductive barrier layer in the second portion of the top surface of the first polymer layer which nonconductive barrier layer does not extend into the first portion of the top surface of the first polymer layer, wherein the barrier layer has a first boundary facing the substrate, the first portion has a second boundary facing away from the substrate, and the first boundary of the barrier layer is closer to the substrate than the second boundary of the first portion, and wherein the integrated circuit structure is part of a fan-out wafer level package, a top surface of the barrier layer of the polymer layer being co-planar with a bottom surface of the UBM.

12. The integrated circuit structure of claim 11, wherein the nonconductive barrier layer extends into the first polymer layer to a depth of from about 1 nm to about 10 nm.

13. The integrated circuit structure of claim 11, wherein the second portion of the top surface of the first polymer layer has a higher hydrogen concentration relative the first portion of the top surface of the first polymer layer.

14. The integrated circuit structure of claim 11, further comprising a second substrate having a second post-passivation interconnect (PPI) structure over the second substrate and a molding compound interjacent the substrate and the second substrate and interjacent the PPI structure and the second PPI structures.

15. The integrated circuit structure of claim 11, further comprising a second polymer layer underlying the first polymer layer, and wherein the PPI structure is formed in an opening of the second polymer layer and electrically connected to the metal pad.

16. The integrated circuit structure of claim 11, further comprising:
    another substrate;
    another metal pad over the another substrate;
    another post-passivation interconnect (PPI) structure over the another substrate and electronically connected to the another metal pad;
    another first polymer layer over the another PPI structure, the another first polymer layer having another top surface;
    another under bump metallurgy (UBM) extending into another opening in the another first polymer layer and electronically connected to the another PPI structure, wherein the another UBM extends over a first portion of the another top surface of the another first polymer layer and does not extend over a second portion of the another top surface of the another first polymer layer; and
    wherein the another top surface of the another first polymer layer comprises another nonconductive barrier layer in the second portion of the another top surface of the another first polymer layer which another nonconductive barrier layer does not extend into the first portion of the another top surface of the another first polymer layer, the second portion of the another top surface of the another first polymer layer having a higher hydrogen concentration relative the first portion of the another top surface of the another first polymer layer.

17. The integrated circuit structure of claim 1, wherein the treated portion has a constant thickness in a direction perpendicular to a major surface of the substrate.

18. The integrated circuit structure of claim 7, wherein the barrier layer has a top surface that remains planar as the barrier layer extends from the UBM.

19. The integrated circuit structure of claim 11, wherein the barrier layer and the first portion of the top surface of the first polymer layer share an interface perpendicular to a major surface of the substrate, the interface having a distance that is equal to a thickness of the barrier layer.

20. The integrated circuit structure of claim 7, wherein the barrier layer has a first portion of the barrier layer and a second portion of the barrier layer, wherein the first portion of the barrier layer covers the molding compound and the second portion of the barrier layer covers the copper pillar.

* * * * *